United States Patent
Watanabe et al.

(10) Patent No.: US 12,101,075 B2
(45) Date of Patent: Sep. 24, 2024

(54) PIEZOELECTRIC DEVICE AND MANUFACTURING METHOD OF THE SAME

(71) Applicant: NIHON DEMPA KOGYO CO., LTD., Tokyo (JP)

(72) Inventors: Tetsuya Watanabe, Saitama (JP); Takahiro Ohtsuka, Saitama (JP); Kazuhiko Osawa, Saitama (JP); Kazuhiro Hirota, Saitama (JP); Yoshiro Teshima, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 790 days.

(21) Appl. No.: 17/238,211

(22) Filed: Apr. 23, 2021

(65) Prior Publication Data

US 2022/0263487 A1     Aug. 18, 2022

(30) Foreign Application Priority Data

Feb. 12, 2021     (JP) ................. 2021-020484

(51) Int. Cl.
| | | |
|---|---|---|
| *H03H 9/02* | (2006.01) | |
| *H03H 3/02* | (2006.01) | |
| *H03H 9/05* | (2006.01) | |
| *H03H 9/10* | (2006.01) | |
| *H03H 9/19* | (2006.01) | |
| *H10N 30/082* | (2023.01) | |

(52) U.S. Cl.
CPC .......... *H03H 9/02023* (2013.01); *H03H 3/02* (2013.01); *H03H 9/0509* (2013.01); *H03H 9/1021* (2013.01); *H03H 9/19* (2013.01); *H10N 30/082* (2023.02); *H03H 2003/022* (2013.01)

(58) Field of Classification Search
CPC .. H10N 30/082; H03H 2003/022; H03H 9/19; H03H 9/1021; H03H 9/0509; H03H 9/02023; H03H 3/02
See application file for complete search history.

(56) References Cited

U.S. PATENT DOCUMENTS

| | | | |
|---|---|---|---|
| 10,659,005 B2 * | 5/2020 | Kuwahara | .......... H03H 9/02133 |
| 2018/0212587 A1 * | 7/2018 | Yamamoto | ............. H03H 9/177 |
| 2019/0051814 A1 * | 2/2019 | Sato | ..................... H10N 30/883 |

(Continued)

FOREIGN PATENT DOCUMENTS

JP     2016197778     11/2016

*Primary Examiner* — J. San Martin
(74) *Attorney, Agent, or Firm* — JCIPRNET (57) ABSTRACT

A piezoelectric device includes a conductive adhesive, a container, and an AT-cut crystal element. The AT-cut crystal element has at least one side surface intersecting with a Z'-axis of the crystallographic axis of the crystal constituted of three surfaces. When a dimension of a straight-line portion along the Z'-axis of a second side opposed to the first side is expressed as W1 and a dimension along the Z'-axis of the AT-cut crystal element is expressed as W0, W1/W0 is 0.91 or greater, and the straight-line portion has both sides constituting corner portions in approximately right angles with sides along an X-axis of the crystal of the AT-cut crystal element. The side of the first side is at a −X-side in an X-axis of the crystallographic axis of the crystal and a side of the second side is at a +X-side in the X-axis.

7 Claims, 10 Drawing Sheets

(56) References Cited

U.S. PATENT DOCUMENTS

| | | | |
|---|---|---|---|
| 2019/0326876 A1* | 10/2019 | Toshikawa | H03H 9/02062 |
| 2020/0169244 A1* | 5/2020 | Teramura | H03H 9/0552 |
| 2020/0195224 A1* | 6/2020 | Matsuo | H03H 9/19 |
| 2021/0135650 A1* | 5/2021 | Shimao | H03H 9/02157 |

* cited by examiner

PIEZOELECTRIC DEVICE AND MANUFACTURING METHOD OF THE SAME

CROSS-REFERENCE TO RELATED APPLICATIONS

This application is based on and claims priority under 35 U.S.C. § 119 to Japanese Patent Application No. 2021-020484, filed on Feb. 12, 2021, and the entire content of which is incorporated herein by reference.

TECHNICAL FIELD

This disclosure relates to a piezoelectric device, such as a crystal unit, a crystal controlled oscillator including the crystal unit, and a crystal unit that uses a temperature sensor, such as a thermistor and a PN diode, together, and a manufacturing method of the same.

DESCRIPTION OF THE RELATED ART

A photolithography technique and a wet etching technique have been used for manufacturing crystal units to achieve a further compact crystal unit as one kind of a piezoelectric device.

For example, Japanese Unexamined Patent Application Publication No. 2016-197778 by the applicant of this application discloses a crystal unit manufactured using the techniques. Specifically, as illustrated in FIG. 1A to FIG. 1C in Japanese Unexamined Patent Application Publication No. 2016-197778, the crystal unit uses an AT-cut crystal element at least one of whose sides intersecting with a Z'-axis of a crystallographic axis of the crystal is constituted of three surfaces of first to third surfaces.

This crystal unit ensures reducing unnecessary vibrations other than vibrations originated from an AT-cut crystal unit as compared with the conventional ones. Therefore, this crystal unit ensures improving impedance of the crystal unit, or crystal impedance (hereinafter also referred to as CI) compared with the conventional ones.

Although the piezoelectric device disclosed in Japanese Unexamined Patent Application Publication No. 2016-197778 has improved the CI, continuing studies by the inventors of this application have proved that further improvement in CI is possible as described below.

The piezoelectric device disclosed in Japanese Unexamined Patent Application Publication No. 2016-197778 includes the crystal element having the predetermined first to third surfaces, and to obtain the predetermined first to third surfaces, a process that etches a quartz-crystal wafer over a long period of time has been employed. Therefore, when a distal end side of this crystal element, that is, a side opposite to a side supported by a conductive adhesive of the crystal element is viewed in plan view, regions heading for both corner portions from the center of this distal end are in a broadly etched shape into an approximately triangle shape, and a planar area of the crystal element has been reduced by the etched amount (see Comparative Example 1 described later and FIG. 6). With the AT-cut crystal element, considering that the CI is likely to be better as the planer area of the crystal element is wide, the piezoelectric device disclosed in Japanese Unexamined Patent Application Publication No. 2016-197778 has a room for improvement.

It was also found that distal end shapes have different variations depending on whether the distal end side of the crystal element is at a positive side or negative side of an X-axis as a crystallographic axis of the crystal, thus resulting in the differences in CI for piezoelectric devices. Accordingly, this also has a room for improvement.

A need thus exists for a piezoelectric device and a manufacturing method of the same which are not susceptible to the drawback mentioned above.

SUMMARY

According to an aspect of this disclosure, there is provided a piezoelectric device that includes a conductive adhesive, a container, and an AT-cut crystal element. The AT-cut crystal element has an X-Z' surface expressed by crystallographic axes of a crystal as a principal surface. The AT-cut crystal element has a square shape in a planar shape. The AT-cut crystal element has at least one side surface intersecting with a Z'-axis of the crystallographic axis of the crystal constituted of three surfaces. The three surfaces are first to third surfaces intersected in an order of the first to third surfaces. The AT-cut crystal element is connected and secured to the container with the conductive adhesive on a side of a first side among two sides parallel to the Z'-axis. When a dimension of a straight-line portion along the Z'-axis of a second side opposed to the first side is expressed as W1 and a dimension along the Z'-axis of the AT-cut crystal element is expressed as W0, W1/W0 is 0.91 or greater, and the straight-line portion has both sides constituting corner portions in approximately right angles with sides along an X-axis of the crystal of the AT-cut crystal element. The side of the first side is at a −X-side in the X-axis of the crystallographic axis of the crystal and a side of the second side is at a +X-side in the X-axis.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

Hereinafter, embodiments of a piezoelectric device and a manufacturing method of the same of this disclosure will be described with reference to the drawings. Each drawing used in the descriptions is merely illustrated schematically for ensuring understanding these disclosures. In each drawing used in the descriptions, like reference numerals designate identical elements, and therefore such elements will not be further elaborated here in some cases. Shapes, dimensions, materials, and the like described in the following descriptions are merely preferable examples within the scope of this disclosure. Therefore, this disclosure is not limited to only the following embodiments.

1. Description of Piezoelectric Device

Figure 1A:
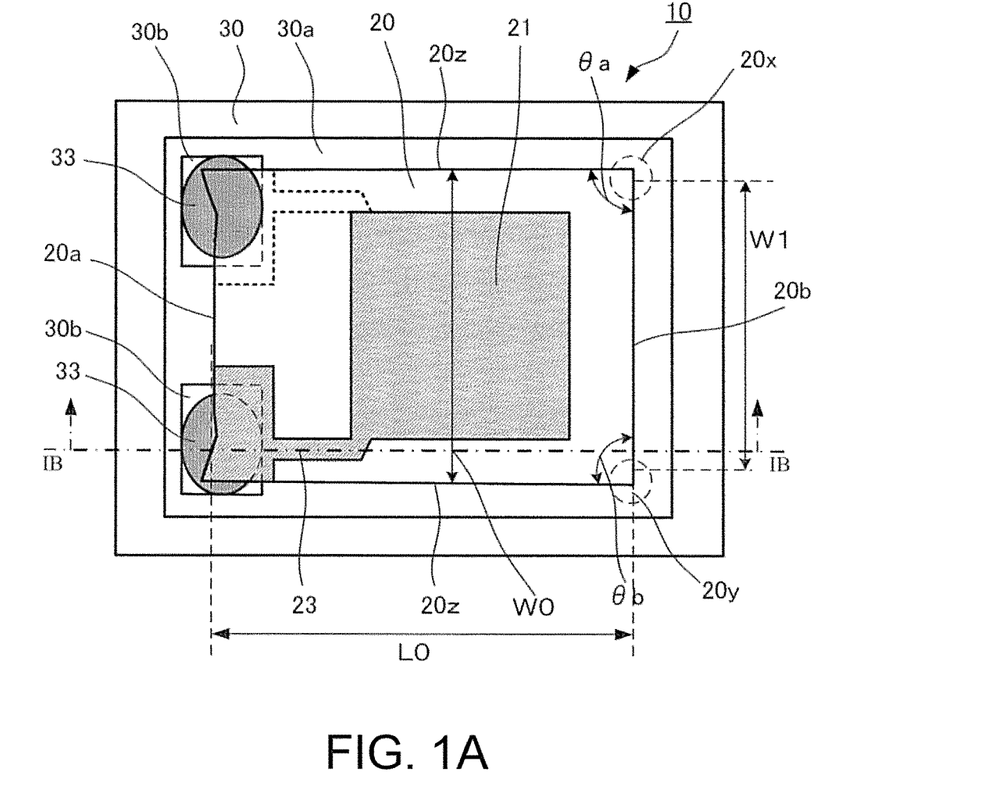
FIG. 1A and FIG. 1B are explanatory drawings of a piezoelectric device 10 according to an embodiment.
Figure 1B:
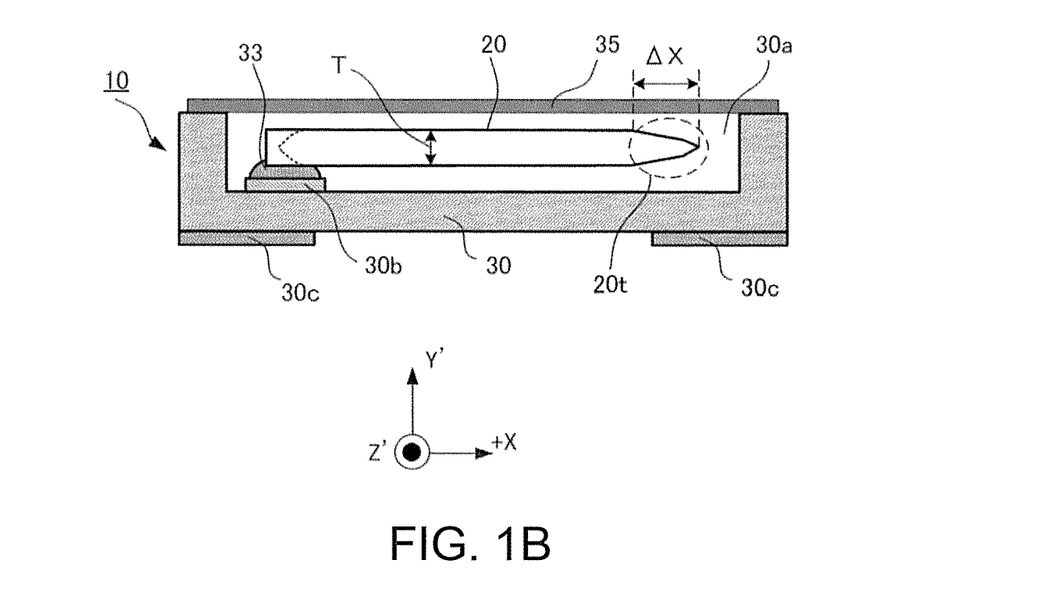
Figure 2A:
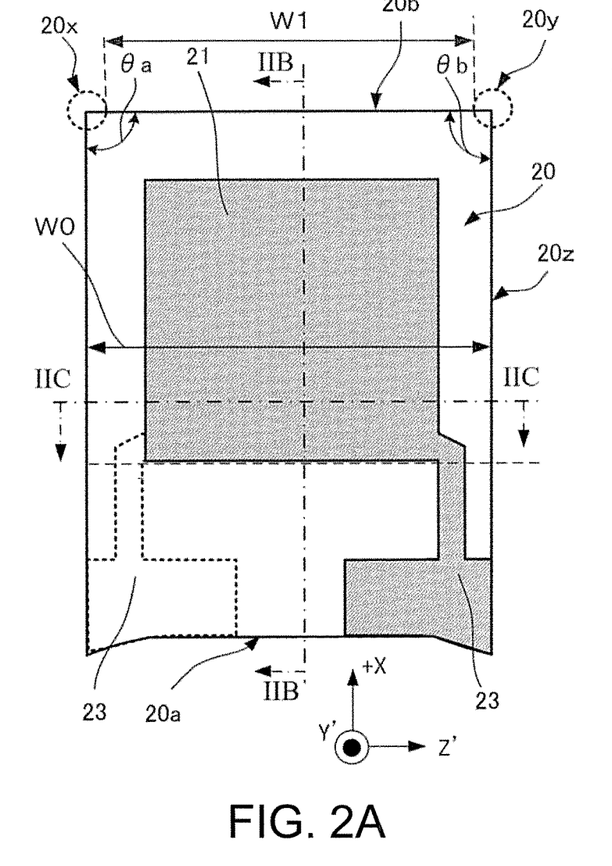
FIG. 2A, FIG. 2B, FIG. 2C and FIG. 2D are explanatory drawings of an AT-cut crystal element 20 provided with the piezoelectric device 10 according to the embodiment.
Figure 2B:
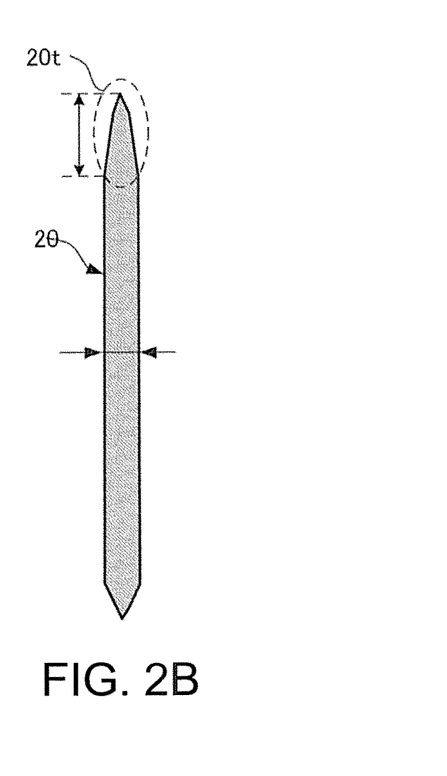
Figure 2C:
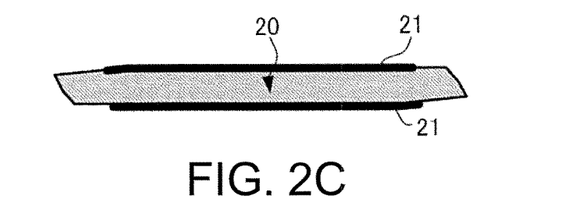
Figure 2D:
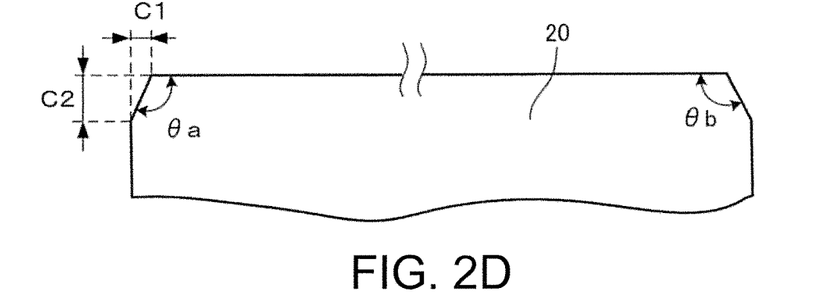
Figure 3A:
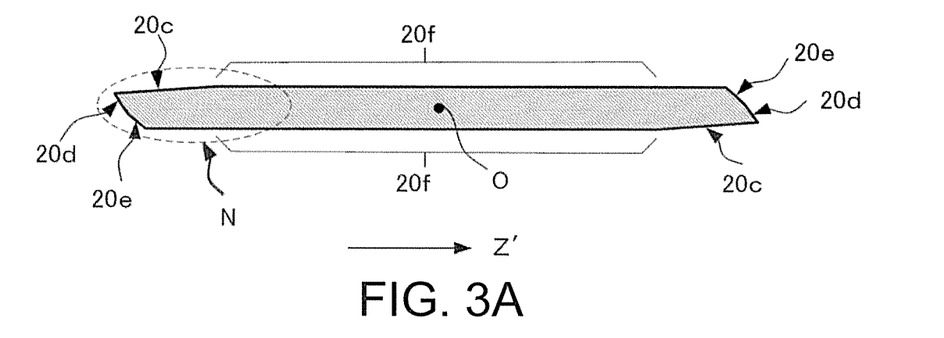
FIG. 3A and FIG. 3B are explanatory drawings illustrating a cross-section of the AT cut crystal element 20 along a Z'-axis of a crystal (along the line IIC-IIC in FIG. 2A)
Figure 3B:
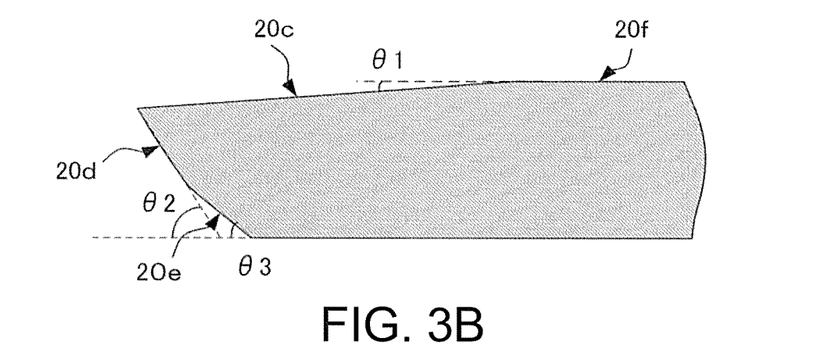
Figure 3C:
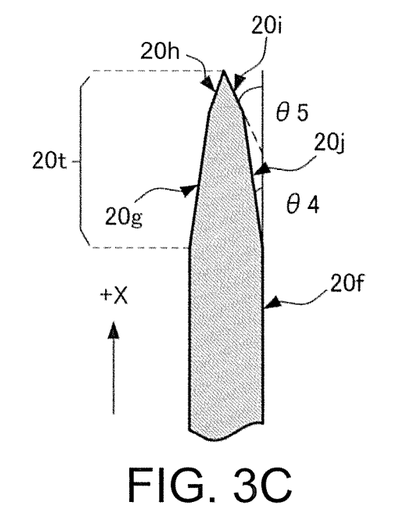
FIG. 3C and FIG. 3D are explanatory drawings illustrating a cross-section of the AT-cut crystal element 20 taken along an X-axis of the crystal (along the line IIB-IIB in FIG. 2A)
Figure 3D:
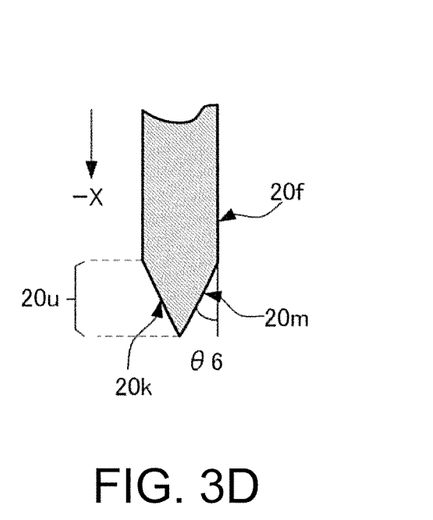

First, the description of a piezoelectric device 10 of an embodiment is provided with reference to FIG. 1A to FIG. 3D. Here, FIG. 1A is a top view of the piezoelectric device 10, and FIG. 1B is a cross-sectional view of the piezoelectric device 10 along the line IB-IB in FIG. 1A. Note that FIG. 1A omits an illustration of a lid member 35 provided with the piezoelectric device 10 in FIG. 1B. FIG. 2A is a top view of an AT-cut crystal element 20 provided with the piezoelectric device 10 of the embodiment, FIG. 2B is a cross-sectional view of the crystal element 20 along the line IIB-IIB in FIG. 2A, FIG. 2C is a cross-sectional view of the crystal element 20 along the line IIC-IIC in FIG. 2A, and FIG. 2D is an enlarged view of a distal end portion of the crystal element 20 in FIG. 2A. FIG. 3A is a drawing describing a side surface intersecting with a Z'-axis of a crystal of the AT-cut crystal element 20, and FIG. 3B is a drawing illustrating an enlarged part N in FIG. 3A. FIG. 3C is an enlarged view of a portion at a +X-side in the sectional drawing illustrated in FIG. 2B. FIG. 3D is an enlarged view of a portion at a −X-side in the sectional drawing illustrated in FIG. 2B. Note that the coordinate axes X, Y', and Z' illustrated in FIG. 2A, FIG. 3A to FIG. 3D each indicate a crystallographic axis of the crystal in the AT-cut crystal element 20 (hereinafter may be abbreviated as the crystal element 20).

A planar shape of the crystal element 20 of this embodiment is a rectangular shape and is an AT-cut crystal element having long sides parallel to the X-axis of the crystal and short sides parallel to the Z'-axis of the crystal.

This crystal element 20 includes excitation electrodes 21 and extraction electrodes 23 on both principal surfaces. The extraction electrodes 23 are extracted from the excitation electrodes 21 to the proximity of both ends of a first side 20a, one of the sides of the crystal element 20. The first side 20a is a side at the −X-side of the X-axis of the crystal of the crystal element 20, while a second side 20b opposed to the first side 20a is a side at the +X-side of the X-axis of the crystal of the crystal element 20.

As illustrated in FIG. 1A and FIG. 1B, this crystal element 20 is mounted in a depressed portion 30a of a container 30. Specifically, this crystal element 20 is secured to support pads 30b of the container 30 on the first side 20a side and near both ends along the first side 20a with conductive adhesives 33. Therefore, the crystal element 20 is configured to be held in a cantilever manner by the container 30 at the first side 20a side, or at the −X-side of the X-axis of the crystal of the crystal element 20, and to have a free end at the +X-side of X-axis of the crystal of the crystal element 20.

As the container 30, for example, a package made of ceramic is usable. External mounting terminals 30c to connect this piezoelectric device 10 to another electronic device are disposed on a bottom surface outer side of this container 30. The support pads 30b and the external mounting terminals 30c are connected with, for example, a via-wiring (not illustrated).

The preferred lid member 35 is joined to a dike surrounding the depressed portion 30a of the container 30, and thus the crystal element 20 is sealed in the container 30.

When the crystal element 20 has a dimension of a straight-line portion along the Z'-axis of the second side 20b, which is opposed to the first side 20a, expressed as W1 and a dimension along the Z'-axis of the crystal element 20 expressed as W0, W1/W0 is 0.91 or greater. Both sides of the straight-line portion form corner portions 20x and 20y in an approximately right-angle with sides 20z along the X-axis of the crystal of the AT-cut crystal element.

Here, it is ideal for the corner portions 20x and 20y in an approximately right-angle to achieve a true right-angle, but an effect of the etching anisotropy or the like, which has been previously mentioned, causes the corner portions to have an approximately right-angle slightly different from the true right-angle. Specifically, both the sides of the straight-line portion as the dimension W1 form the corner portions in an approximately right-angle having angles θa, θb formed by the second side 20b and the sides 20z along the X-axis of the crystal of the AT-cut crystal element, as illustrated in FIG. 1A and FIG. 2D. These angles θa, θb are preferred to be 90° to 115° from the results of Working Examples, in particular, Working Example 2 described later. The length of the AT-cut crystal element along the X-axis of the crystal is L0.

Alternatively, both the sides of the straight-line portion as the dimension W1 form the corner portions in an approximately right-angle with a dimension along the Z'-axis being expressed as C1 and a dimension along the X-axis being expressed as C2 that is greater than C1 described above, in the notation of C chamfer plane, and with C2/C1 falling within a predetermined range. This predetermined C2/C1 is preferred to be 2.7 to 4.3 from the results of Working Examples, in particular, Working Example 2 described later.

Note that, the angles θa, θb as described above may be either the same angle or different angles. In addition, C2/C1 at right and left corner portions in an approximately right-angle may be either the same or different.

Here, θa, θb, C1, C2 and W1 vary according to a predetermined width W (see FIG. 4C) of a fourth pattern described in a later-described manufacturing method, etching time for quartz-crystal wafers with a hydrofluoric acid-based etchant, and the like. W1/W0 is preferred to obtain 1 or a value close to 1. Therefore, the predetermined width W of the fourth pattern and the etching time for the quartz-crystal wafers with the hydrofluoric acid-based etchant are preferred to be set such that W1/W0 obtains the value close to 1. As W1/W0 approaches 1, the angles θa, θb approach right angles, and C1 and C2 approach 0.

As illustrated in FIG. 3A and FIG. 3B, the side surfaces (Z'-surfaces) intersecting with the Z'-axis of the crystal of the crystal element 20 are side surfaces each constituted of three surfaces, a first surface 20c, a second surface 20d, and a third surface 20e. Moreover, the first surface 20c is a surface that intersects with a principal surface 20f of this crystal element 20, and is a surface equivalent to a surface formed by rotating the principal surface 20f by θ1 with the X-axis of the crystal as a rotation axis.

Moreover, the first surface 20c, the second surface 20d, and the third surface 20e intersect in this order. The second surface 20d is a surface equivalent to a surface formed by rotating the principal surface 20f by θ2 with the X-axis of the crystal as a rotation axis, and the third surface 20e is a surface equivalent to a surface formed by rotating the principal surface 20f by θ3 with the X-axis of the crystal as a rotation axis. Moreover, the two side surfaces are in a relationship of point symmetry with respect to a center point O of the crystal element.

It has been found through experiments by this applicant have found that the above-described angles θ1, θ2, and θ3 are preferably as follows. θ1=4°±3.5°, θ2=−57°±5°, θ3=−42°±5°, and more preferably θ1=4°±3°, θ2=−57°±3°, and θ3=−42°±3°.

With the crystal element having the side surfaces that has been described using FIG. 3A and FIG. 3B, the side surfaces have a unique beak shape. This allows damping unnecessary vibrations propagating in the Z'-direction and allows contributing to improvement in a property of the piezoelectric device.

Since Japanese Unexamined Patent Application Publication No. 2016-197778 by this applicant discloses this structure, the detailed description is omitted here.

The crystal element 20 has a side on the second side 20b (see FIG. 2A) that serves as a tapered portion 20t (also referred to as a front end tapered portion 20t) where a thickness decreases along the X-axis of the crystal and toward a side of the second side 20b, as illustrated in FIG. 2B and FIG. 3C in particular. More specifically, the tapered portion 20t is a tapered portion constituted with four surfaces, a fourth surface 20g, a fifth surface 20h, a sixth surface 20i, and a seventh surface 20j as illustrated in FIG. 3C. The fourth surface 20g and the seventh surface 20j are symmetrical about the X-axis, while the fifth surface 20h and the sixth surface 20i are symmetrical about the X-axis. The angle θ4 formed by the principal surface 20f of the crystal element 20 and the fourth surface 20g or the seventh surface 20j is at an angle of θ4=4°±5°, and preferably, θ4=4°±3°. The angle θ5 formed by the principal surface 20f of the crystal element 20 and the fifth surface 20h or the sixth surface 20i is at an angle of θ5=27°±5°, and preferably, θ5=27°±3°.

On the other hand, an end portion at the −X-side of the crystal element 20 has a tapered portion 20u (also referred to as a rear tapered portion 20u) decreasing in thickness along the X-axis of the crystal and toward the side of the first side 20a (see FIG. 2A), as illustrated in FIG. 3D. The rear tapered portion 20u is constituted of two surfaces, an eighth surface 20k and a ninth surface 20m. The eighth surface 20k and the ninth surface 20m are symmetrical about the X-axis. The angle θ6 formed by the principal surface 20f of the crystal element 20 and the eighth surface 20k or the ninth surface 20m is at an angle of θ6=17°±5°, and preferably, θ6=17°±3°.

2. Description of Method for Manufacturing Piezoelectric Device

Figure 4A:
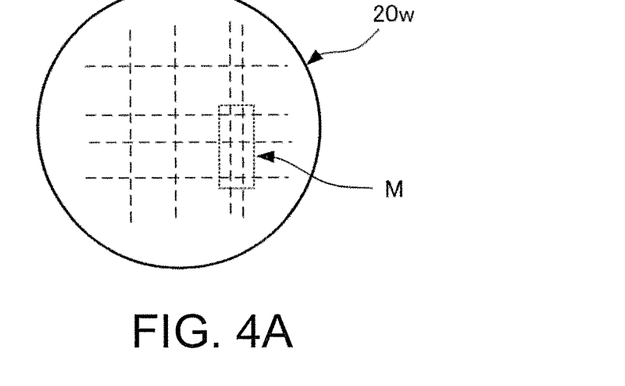
FIG. 4A, FIG. 4B, and FIG. 4C are drawings describing main parts of a manufacturing method of the piezoelectric device 10 according to the embodiment.
Figure 4B:
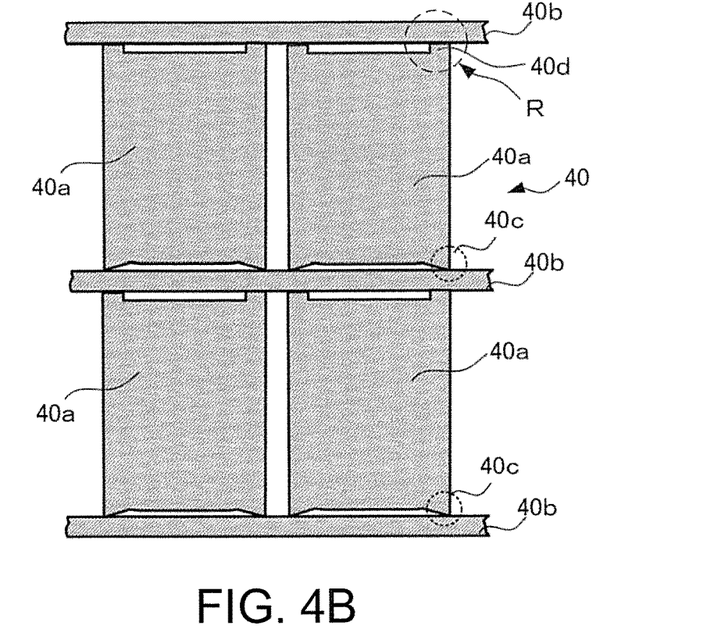
Figure 4C:
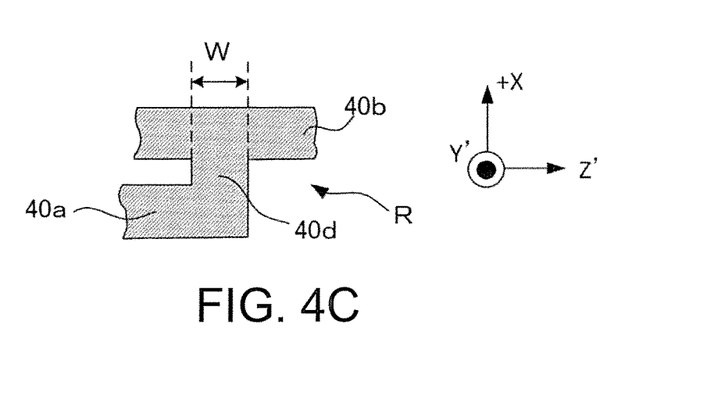
Figure 5A:
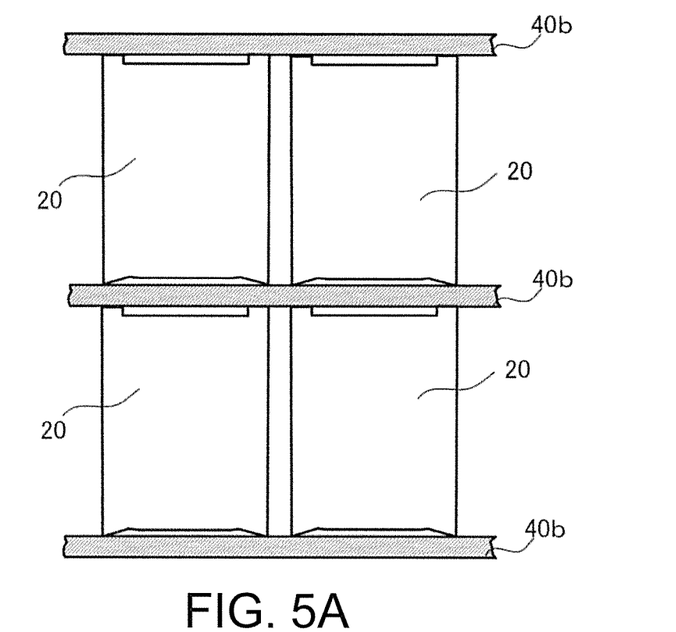
FIG. 5A and FIG. 5B are explanatory drawings following with FIG. 4B of the manufacturing method of the piezoelectric device 10 according to the embodiment.
Figure 5B:
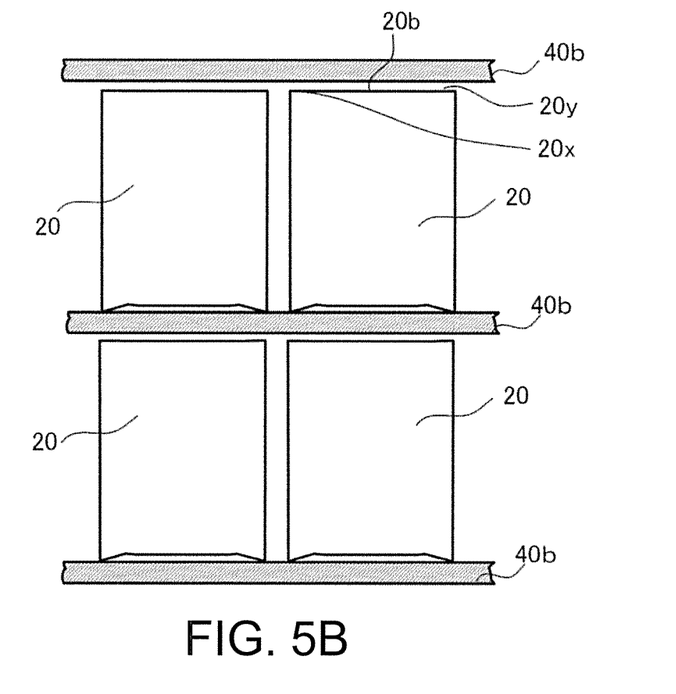

Next, with reference to FIG. 4A to FIG. 4C and FIG. 5A and FIG. 5B, the preferred method for manufacturing the piezoelectric device 10 of the embodiment will be described. FIG. 4A to FIG. 4C are drawings describing main parts of a step of manufacturing the crystal element 20 used for the piezoelectric device 10. Especially, FIG. 4A is a plan view describing a quartz-crystal wafer 20w in a middle state. FIG. 4B is a drawing illustrating a state in which an etching resist mask 40 is formed on this quartz-crystal wafer and is a plan view illustrating an enlarged part M in FIG. 4A. FIG. 4C is a drawing describing means to form the corner portions 20x, 20y at the distal end side of the crystal element 20 in approximately right angles and is a plan view illustrating an enlarged part R in FIG. 4B. FIG. 5A and FIG. 5B are drawings describing a state in which the step proceeds from the state of FIG. 4B.

The disclosure of the manufacturing method of this application manufactures the crystal element 20 by photolithography technique and wet etching technique.

Specifically, the crystal element 20 is manufactured using the etching resist mask 40 (see FIG. 4B) for wet etching that includes first mask portions 40a, second mask portions 40b, third mask portions 40c, and fourth mask portions 40d. The first mask portions 40a form a pattern of the AT-cut crystal elements 20 in a matrix. The second mask portions 40b extend along a direction equivalent to the Z'-axis in the matrix to form a pattern for forming crosspieces arranged in sequence along the direction of the X-axis. The third mask portions 40c form a bridge pattern to hold the AT-cut crystal elements on the crosspieces after this wet etching. The fourth mask portions 40d are disposed between corner portions on the sides of the second sides (the distal end side) of the AT-cut crystal elements and the third mask portions and have a predetermined width W to disappear the crystals at the locations at the completion of this wet etching. Note that the fourth mask portions 40d are disposed between parts corresponding to the two corner portions on the distal end side of the crystal element of the first mask portion 40a, that is, the +X-side of the X-axis of the crystal of the crystal element 20, and the second mask portions 40b.

Specifically, metal films having an etching resistance property are formed on front and back surfaces of the quartz-crystal wafer 20w, photoresists are applied over the surfaces, an exposure or the like is performed on the photoresists using a photomask for forming the first to fourth mask portions as described above, and thereafter, the metal films are selectively removed, and thus this etching resist mask 40 can be formed. However, the etching resist masks 40 are formed on the quartz-crystal wafer 20w such that the fourth mask portions 40d are at the +X-side of the X-axis of the crystal.

The width W (see FIG. 4C) in the direction along the Z'-axis of the crystal of the fourth mask portion 40d is configured as a predetermined width (see Working Examples and the like) so that the crystal part below the fourth mask portion 40d disappears after completion of a second etching step described later.

Next, a first etching step that dips the quartz-crystal wafer on which the etching resist mask 40 has been formed in a hydrofluoric acid-based wet etching liquid for a predetermined period is performed. This first etching step is to form an outer shape of the crystal element 20.

Next, the first mask portions 40a and the fourth mask portions 40d are removed from the quartz-crystal wafer on which the first etching step has been performed. This embodiment also removes the third mask portions 40c.

Such mask portions can be processed by the well-known photolithography technique. However, when a size of the third mask portion 40c is small, the third mask portion 40c may be remained without removal.

When the above-described etching resist mask process has been finished, crystal parts covered with the first, second, and third mask portions are exposed (see FIG. 5A).

Next, the second etching step that dips the quartz-crystal wafer from which the first, second, and third mask portions have been removed in the hydrofluoric acid-based wet etching liquid for a predetermined period is performed. This second etching step is to adjust a frequency of the crystal element 20 and form predetermined first to third surfaces on the side surface intersecting with the Z'-axis of a crystal. Since the width W was configured as the predetermined width, crystal parts exposed by removing the above-described fourth mask portions 40d disappear in this second etching. In view of this, since both corner portions 20x, 20y of the second side 20b as the side on the side not secured to the container of the crystal element 20 appear as the corner portions for the first time around the end of the second etching, the corner portions 20x, 20y have approximately right angles even after the wet etching, and the part between these corner portions 20x, 20y of the second side 20b has the linear shape.

An excitation electrode and an extraction electrode are formed on the quartz-crystal wafer on which the second etching step has been performed, this AT-cut crystal element is diced from the quartz-crystal wafer on which the formation of the excitation electrode and the like has been finished, the diced crystal element is secured to the container 30 (see FIG. 1A and FIG. 1B) at the end portion at the −X-side with the conductive adhesives, and afterwards, the container is sealed with the lid member in a state where the inside of the container is set under a predetermined atmosphere, and thus the piezoelectric device 10 according to this disclosure can be manufactured.

3. Working Examples and Comparative Examples

In order to deepen the understanding of this disclosure, some Working Examples and Comparative Examples will be described below.

3-1. Working Example 1 and Comparative Example 1: Experiment on Planer Shape at Distal End Side of Crystal Element First, the following Working Example 1 and Comparative Example 1 were performed to examine effects of the planar shape at the side of the distal end of the crystal element on properties of the piezoelectric device.

As piezoelectric devices of Working Example 1, a plurality of AT-cut crystal elements with an oscillation frequency of 27.12 MHz, an X dimension of about 870 μm, and a Z' dimension of about 640 μm were manufactured by the above-described manufacturing method, the crystal elements were mounted on containers, and further, the containers were sealed with lid members, thus manufacturing a plurality of the piezoelectric devices of Working Example 1.

Additionally, although the frequency, the X dimension, and the Z' dimension were same as those of Working Example 1 described above, as piezoelectric devices of Comparative Example 1, a plurality of crystal elements of Comparative Example 1 were manufactured using an etching resist mask not including the fourth mask portions 40d (see FIG. 4B) when the crystal elements were manufactured, the crystal elements were mounted in containers, and further, the containers were sealed with lid members, thus manufacturing a plurality of the piezoelectric devices of Comparative Example 1.

However, the following changes have been made in the manufacturing method described above to manufacture the crystal elements of Working Example 1 and Comparative Example 1. That is, the etching resist mask was disposed on the quartz-crystal wafer such that the −X-side of the X-axis of the crystal was at the distal end side of the crystal element. Also, when the crystal element was secured to the container, the end portion on the positive side of the X-axis of the crystal of the crystal element was secured with the conductive adhesive to the container. This is because such an arrangement of the crystallographic axes and securing position was deemed to ensure excluding an influence degree of the shape of the corner portions at the distal end of the crystal element described later and to be easy to determine only an influence degree of the shape of the corner portions.

Figure 6:
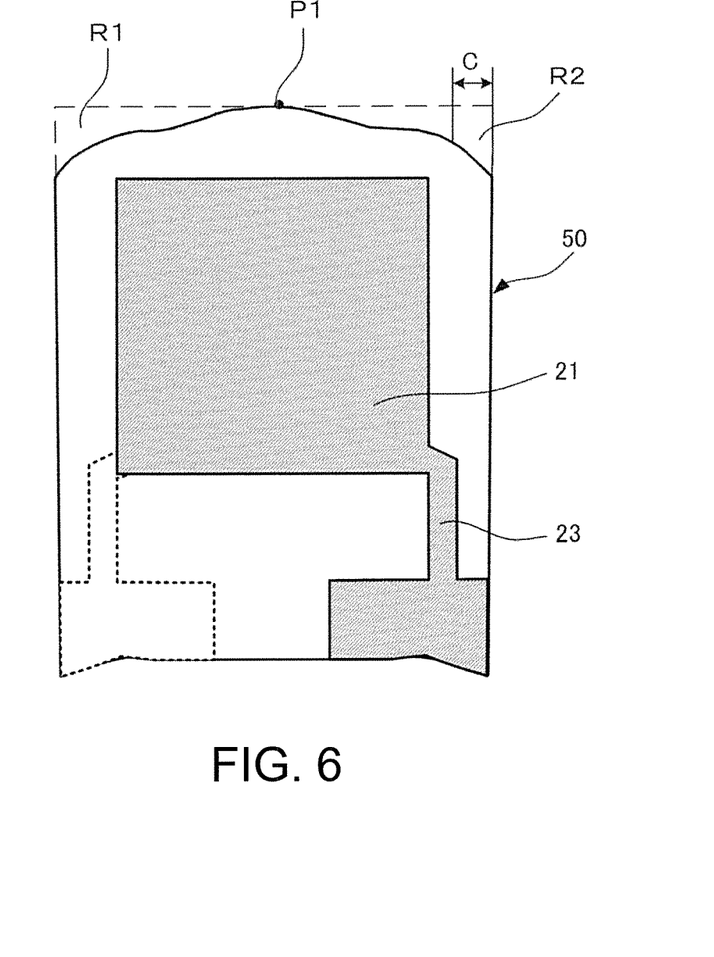
FIG. 6 is an explanatory drawing of Comparative Example 1 in a plan view describing an AT-cut crystal element 50 when an angle shape of the distal end side of the crystal element is not considered.

FIG. 6 is a plan view replicating the crystal element 50 manufactured as Comparative Example 1. In the crystal element 50 of Comparative Example 1, when the distal end side, that is, a side opposite to a side supported by the conductive adhesives of the crystal element, is viewed in plan view, respective regions R1, R2 heading from a center P1 at the distal end to both corner portions are etched in approximately triangle shapes, and an area of the crystal element is reduced by the amount.

Figure 8A:
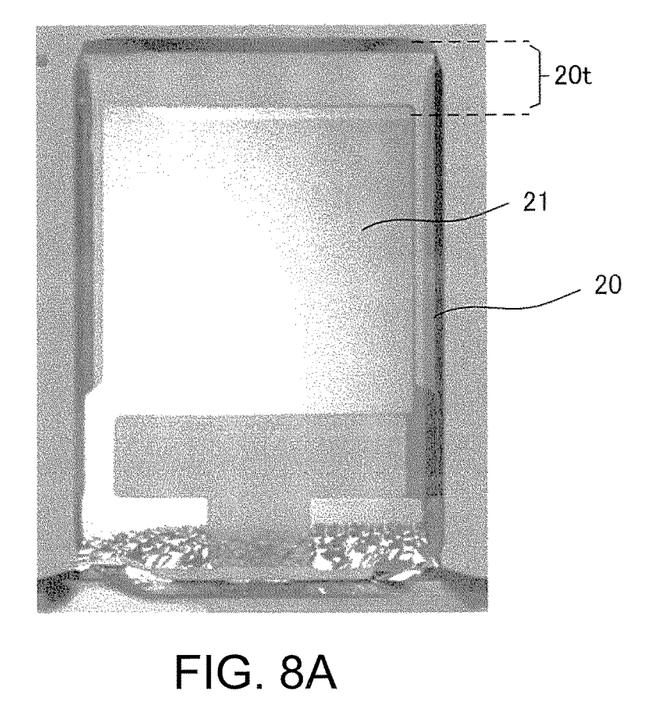
FIG. 8A and FIG. 8B are explanatory drawings of Working Example 2 and Comparative Example 2, and are metal photomicrographies of the respective crystal elements of when the distal end of the crystal element is at a +X-side of the X-axis of the crystal (FIG. 8A) and when it is at a −X-side of the X-axis (FIG. 8B)
Figure 8B:
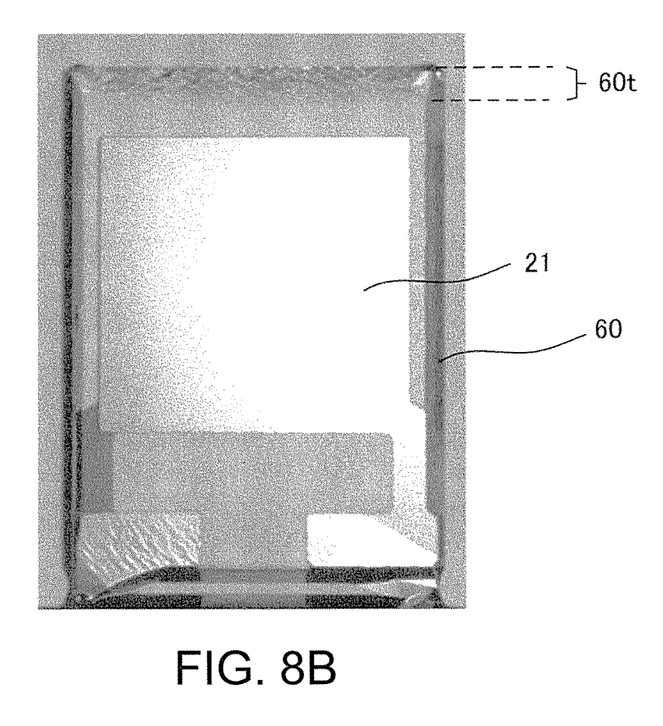

On the other hand, the crystal element used in Working Example 1 has the straight-line portion of the second side 20b having a large dimension and both sides of this straight-line portion having approximately right angles (see FIG. 8B). In other words, the crystal element in Working Example 1 has a relatively rectangular shape as viewed in plan view.

The angles θa, θb (see FIG. 1A and FIG. 1B, and FIG. 2A to FIG. 2D) of an approximately right-angled corner portions (the corner portions corresponding to the corner portions 20x and 20y in FIG. 1A to FIG. 2D) at the distal end side of the plurality of crystal elements used in Working Example 1 were measured with a measurement microscope. It was found that the angles θa, θb were in a range from 85 degrees to 90 degrees, and it was found that W1 was in a range from 605 μm to 632 μm. The aimed Z' dimension near the center of the crystal element, namely, the dimension W0, is 640 μm, and the actual measurement found that the width dimension W0 was in a range from 638 μm to 650 μm. Therefore, when W1/W0 is calculated from the respective actually measured values W1, W0 described above, the lower limit is 605/650≈0.93, and the upper limit is 632/638≈0.99, and therefore, it can be said that W1/W0 is from 0.93 to 0.99 in the samples of Working Example 1. The values of W1/W0 were mostly from 0.96 to 0.99.

Dimensions C (see the dimension C illustrated in FIG. 6) in terms of C chamfer plane of the two corner portions of the distal end portions of each of the plurality of crystal elements used in Working Example 1 and the plurality of crystal elements 50 used in Comparative Examples 1 were measured with a tool maker's microscope. As a result, in the crystal elements of Working Example 1, the dimensions C were from 10 μm to 18 μm, and all of them were 20 μm or less. On the other hand, in the crystal elements 50 of Comparative Example 1, the dimensions C were from 70 μm to 95 μm, and all of them were increased seven times to nine times compared with those of Working Example 1.

Additionally, the measurement of dimensions of the straight-line portion at the distal end portions of the crystal elements 50 of Comparative Example 1 found that the dimensions were narrow, from around 130 μm to 160 μm. Moreover, a part from the end of the straight-line portion to the corner portions of the crystal element had a sloping shoulder shape.

Figure 7A:
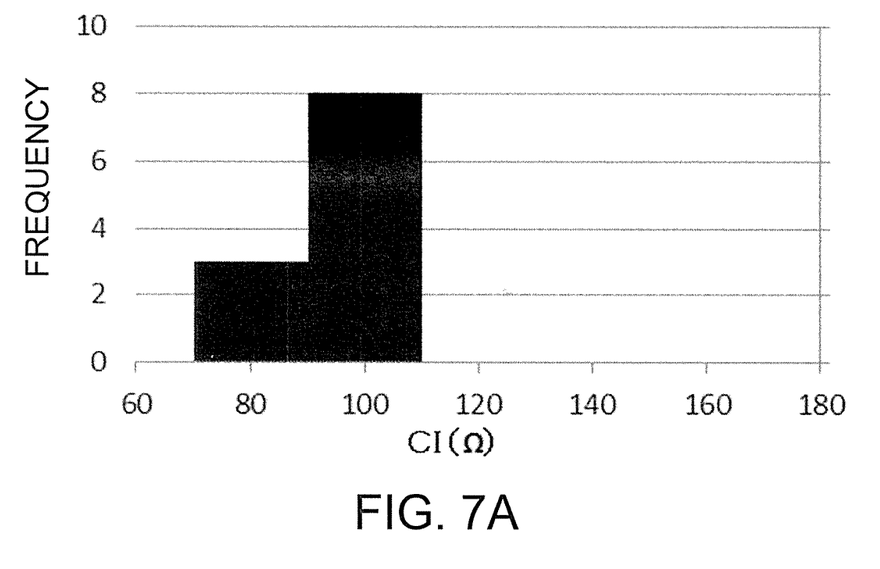
FIG. 7A and FIG. 7B are drawings illustrating differences in CI distribution between when the distal end side of the crystal element are taken into consideration (Working Example 1) and when it is not taken into consideration (Comparative Example 1)
Figure 7B:
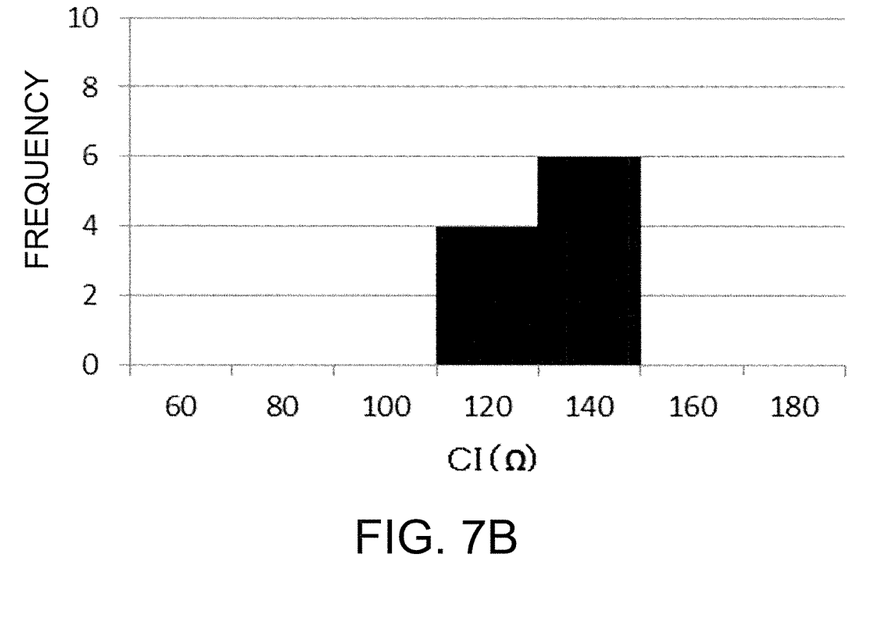

Additionally, the CIs were measured as an electrical property of the respective piezoelectric devices of Working Example 1 and Comparative Example 1. FIG. 7A is a drawing illustrating a CI distribution of the piezoelectric device of Working Example 1, and FIG. 7B is a drawing illustrating a CI distribution of the piezoelectric device of Comparative Example 1. Both drawings plot the CI (Ω) on the horizontal axis and a frequency on the vertical axis. The numbers of samples are 12 pieces for both.

In the CI distribution of the piezoelectric device of Working Example 1, an average value was 83.5Ω and a standard deviation was 6.6Ω, and in the CI distribution of the piezoelectric device of Comparative Example 1, the average value was 123.6Ω and the standard deviation was 13.0Ω. The average value of the CIs was excellent by 40.1Ω and the standard deviation was excellent by 6.4Ω in Working Example 1.

From the results of the CI measurements of Working Example 1 and Comparative Example 1 described above, it is seen that the increased dimension of the straight-line portion of the side at the distal end side of the crystal element and both corner portions having approximately right angles achieve the improved CI compared with the case otherwise.

3-2. Working Example 2 and Comparative Example 2: Experiment with Distal End of Crystal Element at +X-side Next, the following Working Example 2 and Comparative Example 2 were performed to examine an influence degree on a property of the piezoelectric device when the distal end of the crystal element is at the +X-side of the X-axis of the crystal and when the distal end of the crystal element is at the −X-side.

As piezoelectric devices of Working Example 2, a plurality of the crystal elements 20 with an oscillation frequency of 40 MHz, an X dimension of about 750 μm, and a Z' dimension of about 520 μm were manufactured by the above-described manufacturing method. Those crystal elements were secured to containers with the conductive adhesives at the end portion at the −X-side of the crystal, thus manufacturing a plurality of the piezoelectric devices 10 of Working Example 2.

Additionally, although the frequency, the X dimension, and the Z' dimension were same as those of Working Example 2 described above, as piezoelectric devices of Comparative Example 2, a plurality of the crystal elements of Comparative Example 2 were manufactured arranging an etching resist mask on the quartz-crystal wafer such that the −X-side of the X-axis of the crystal was at the side of the distal end of the crystal element contrary to Working Example 2 when the crystal elements were manufactured by the above-described manufacturing method. Those crystal elements were secured to containers with the conductive adhesives at the end portion at the +X-side of the crystal, thus manufacturing a plurality of the piezoelectric devices of Comparative Example 2.

FIG. 8A is a picture of the crystal element 20 of Working Example 2 taken with a metallurgical microscope. FIG. 8B is a picture of a crystal element 60 of Comparative Example 2 taken with the metallurgical microscope. The differences of the distal ends of the crystal elements can be specifically seen through comparing the two pictures.

First, respective measurements were taken for a dimension W0 along the Z'-axis of the central portion of the crystal element 20 in Working Example 2 and a dimension W1 of the straight-line portion of the second side 20b, an angle θa and an angle θb, illustrated in FIG. 2D, of both corner portions 20x, 20y at both sides of this straight-line portion, a dimension C1 of a first C-chamfered portion at the corner portion 20x and a dimension C2 of a second C-chamfered portion. 22 samples were measured. Table 1 shows an average value avg, a standard deviation σ, the maximum value Max, the minimum value Min, avg+3σ, and avg−3σ as the measurement results thereof.

From this Table 1, with the samples of Working Example 1, W1 has avg−3σ=480.6 and W0 has avg+3σ=524.6, therefore (avg−3a of W1)/(avg+3σ of W0)=480.6/524.6=0.916. Also, W1 has avg+3σ=498.9 and W0 has avg−3σ=520.1, therefore, (avg+3σ of W1)/(avg−3σ of W0)=498.9/520.1=0.959. Accordingly, in Working Example 2, W1/W0 as one index of squareness of an approximately right-angled corner portions 20x, 20y is 0.916 to 0.959, and thus, W1/W0 is 0.916 at worst, that is, 0.91. From Table 1, with the samples of Working Example 2, the greatest angle that is farthest from the right angle for the angles θa, θb at an approximately right-angled corner portions 20x, 20y is 114.7° in the row of avg+3σ. That is, about 115°.

From this Table 1, with the samples of Working Example 2, the dimension C1 has avg+3σ=15.4 and the dimension C2 has avg−3σ=42.7, therefore, (avg−3σ of the dimension C2)/(avg+3σ of the dimension C1)=42.7/15.4=2.77. Also, the dimension C1 has avg−3σ−12.2 and the dimension C2 has avg+3σ=52.5, therefore, (avg+3σ of the dimension C2)/(avg−3σ of the dimension C1)=52.5/12.2=4.30. Accordingly, in Working Example 2, C2/C1 as one index of squareness of an approximately right-angled corner portions 20x, 20y is 2.77 to 4.30. The actual C1 in this case, when viewed within a range of ±3σ, is 12.2 to 15.4, that is, about 16 μm or less. The actual C2, when viewed within ±3σ, is 42.7 to 52.5, that is, about 53 μm or less.

TABLE 1

|  | W0 [μm] | W1 [μm] | W1/W0 | θa [°] | θb [°] | C1 [μm] | C2 [μm] | C2/C1 |
|---|---|---|---|---|---|---|---|---|
| avg | 522.4 | 489.8 | 0.9 | 108.6 | 109.5 | 13.8 | 47.6 | 3.46 |
| σ | 0.75 | 3.03 | 0.005 | 1.10 | 1.7 | 0.53 | 1.63 | 0.13 |
| max | 523.9 | 497.3 | 0.949 | 112.1 | 113.7 | 15.6 | 51.8 | 3.73 |
| min | 521.4 | 485.1 | 0.930 | 107.2 | 106.7 | 13.1 | 42.2 | 3.10 |
| avg + 3σ | 524.6 | 498.9 | 0.952 | 111.9 | 114.7 | 15.4 | 52.5 | 3.85 |
| avg − 3σ | 520.1 | 480.6 | 0.923 | 105.3 | 104.4 | 12.2 | 42.7 | 3.06 |

Figure 9A:
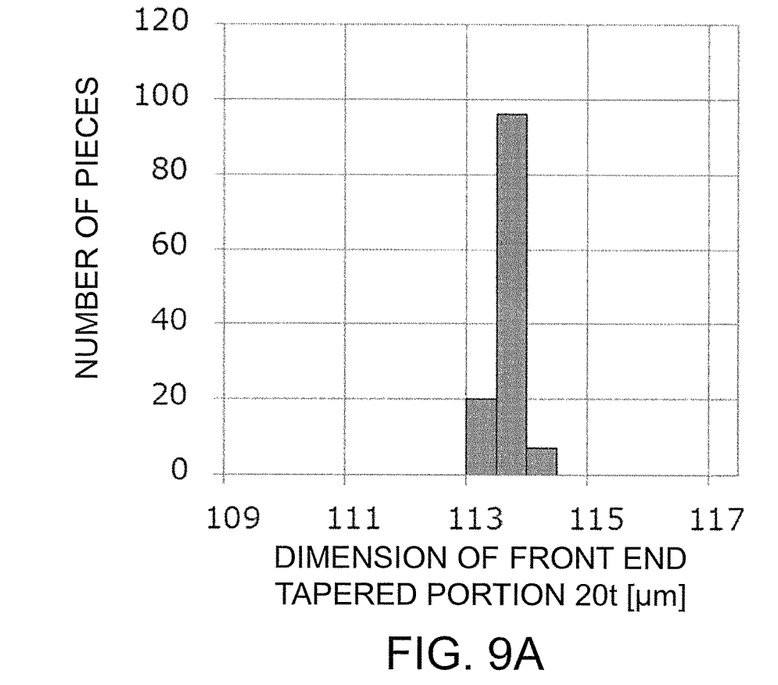
FIG. 9A and FIG. 9B are explanatory drawings of Working Example 2 and Comparative Example 2 comparing distributions of dimensions of front end tapered portions of respective crystal elements when the distal end of the crystal element is at the +X-side of the X-axis of the crystal (FIG. 9A) and when it is at the −X-side of the X-axis of the crystal (FIG. 9B)
Figure 9B:
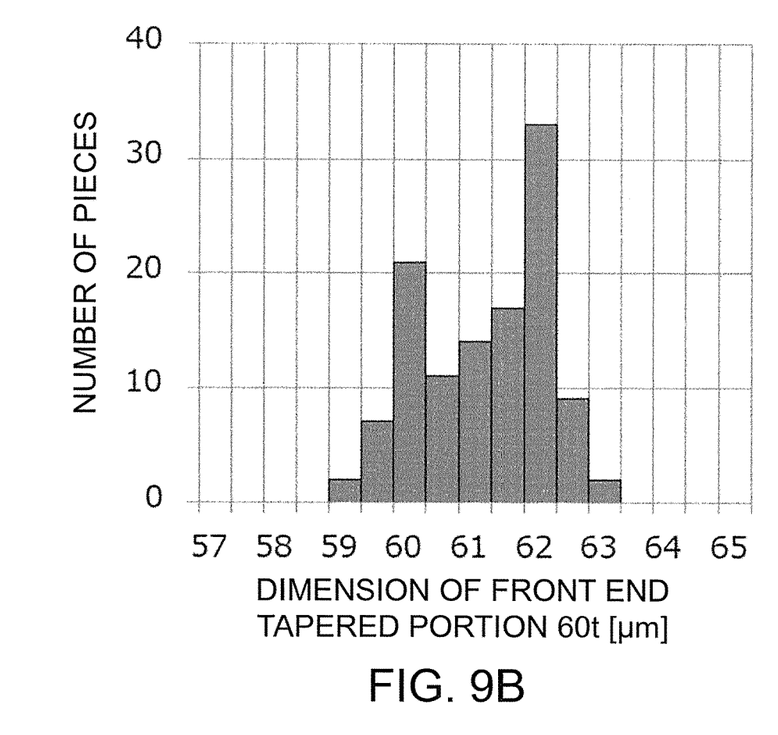

Next, a measurement was taken for a dimension ΔX of the front end tapered portion of each of the crystal element 20 of Working Example 2 and the crystal element 60 (see FIG. 8B) of Comparative Example 2. 120 samples each for Working Example 2 and Comparative Example 2 were measured. Table 2 shows average values avg, standard deviations σ, the maximum values Max, the minimum values Min, avg+3σ, and avg−3σ as the measurement results thereof. FIG. 9A and FIG. 9B illustrate histograms of the measurement results. FIG. 9A is a histogram of the dimension of the front end tapered portion of Working Example 2. FIG. 9B is a histogram of the dimension of the front end tapered portion of Comparative Example 2. Both drawings plot the dimension (μm) of the front end tapered portion (μm) on the horizontal axis and number of pieces on the vertical axis.

From Table 2, the dimension ΔX along the X-axis of the front end tapered portion 20t of the crystal element 20 in Working Example 2 has an average value of 113.2 μm and a standard deviation of 0.19. The dimension ΔX along the X-axis of a front end tapered portion 60t of the crystal element 60 in Comparative Example 2 has an average value of 61 μm and a standard deviation of 0.97 in standard deviations. The anisotropy of crystallographic axes of the crystal for etchant causes differences between the dimension ΔX of the front end tapered portion 20t of the crystal element 20 of Working Example 2 and the dimension ΔX of the front end tapered portion 60t of the crystal element 60 in Comparative Example 2. What is noteworthy here are differences in standard deviations. The standard deviation of the dimension along the X-axis, of the front end tapered portion 60t of the crystal element 60 of Comparative Example 2 is 0.97/ 0.19 =5.1 with respect to the value of Working Example 2, and is a value worsened by 5.1 times. For the crystal units, an ensured planned shape and reduced variations in the planned shape ensure the improved absolute value and variation in property. Moreover, when the crystal unit is designed, a vibrating portion is generally unevenly disposed on the distal end side of the crystal element to reduce an influence of the secured portion to the container on the crystal element. Therefore, since the variation in shape of the distal end side of crystal element easily affects on the vibrating portion, the variation in shape of the distal end side of crystal element is preferred to be small. In that respect, positioning the distal end side of the crystal element at the −X-side of the crystal as in this disclosure is preferred. Furthermore, this can contribute to improve the properties of the piezoelectric device, in combination with the structure where the corner portions at the distal end side of the crystal element are in approximately right angles.

In the case of the crystal element 20 in Working Example 2, avg+3σ=113.8 μm and avg−3σ=112.7 μm in Table 2. Since a thickness T of the crystal element 20 of Working Example 2 is 36.9 when the value of avg±3σ is normalized by the thickness T of the crystal element 20, 3.053 to 3.083 is obtained. That is, ΔX/T is about 3.05 to 3.09.

TABLE 2

|  | COMPARATIVE EXAMPLE 2 | WORKING EXAMPLE 2 |
| --- | --- | --- |
| avg | 61.0 | 113.2 |
| σ | 0.97 | 0.19 |
| Max. | 62.8 | 113.7 |
| Min. | 58.9 | 112.7 |
| avg + 3σ | 63.9 | 113.8 |
| avg − 3σ | 58.1 | 112.7 |

Unit: μm

To show advantages of positioning the distal end side of the crystal element at the −X-side of the crystal, measurements of respective CI were taken for the piezoelectric device (with the structures illustrated in FIG. 1A and FIG. 1B) of Working Example 2 and the piezoelectric device of Comparative Example 2. The number of samples is 580 pieces for each example.

Figure 10A:
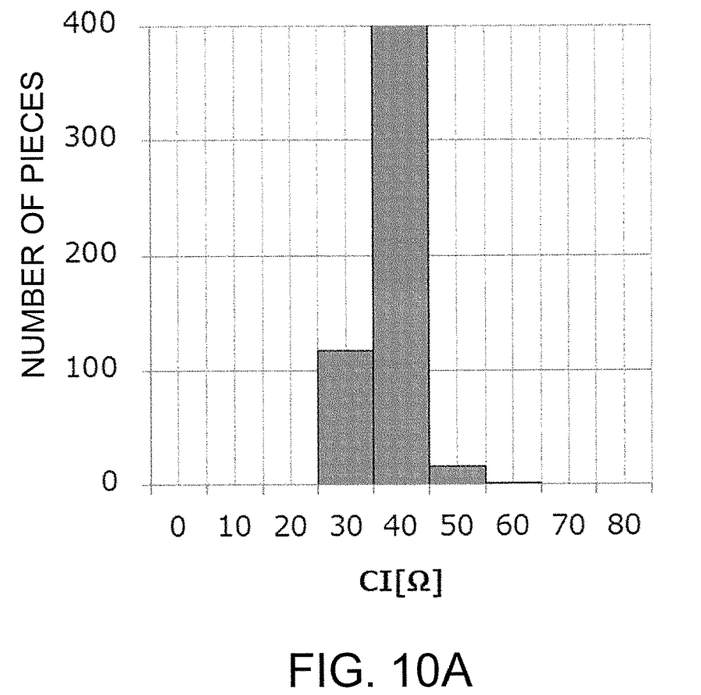
FIG. 10A and FIG. 10B are explanatory drawings of Working Example 2 and Comparative Example 2 comparing distributions of CI of respective piezoelectric devices when the distal end of the crystal element is at the +X-side of the X-axis of the crystal (FIG. 10A) and when it is at the −X-side of the X-axis of the crystal (FIG. 10B).
Figure 10B:
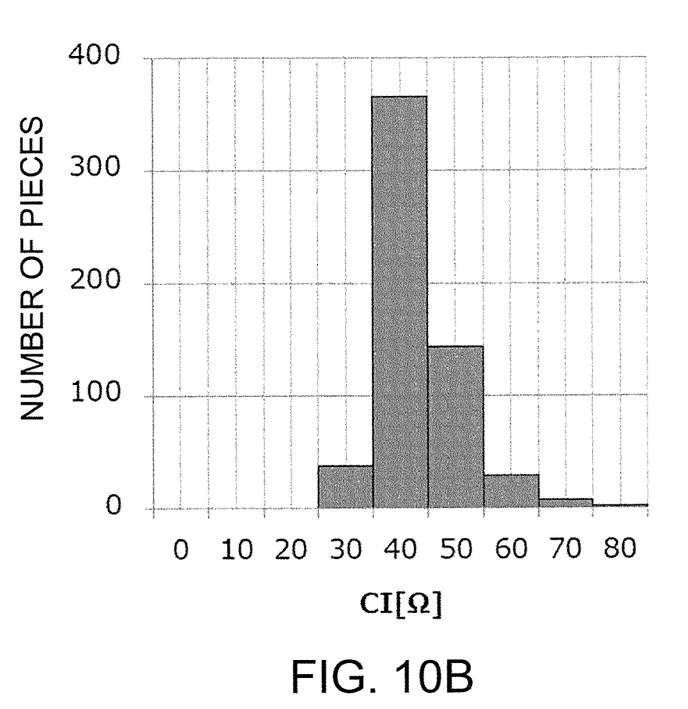

FIG. 10A is a drawing illustrating a CI distribution of the piezoelectric device of Working Example 2, and FIG. 10B is a drawing illustrating a CI distribution of the piezoelectric device of Comparative Example 2. Both drawings plot the CI (Ω) on the horizontal axis and number of pieces on the vertical axis.

The CI distribution of the piezoelectric device of Working Example 2 showed that the average value was 32.4Ω and a standard deviation was 3.2Ω, while the CI distribution of the piezoelectric device of Comparative Example 2 showed that the average value was 38.4Ω and a standard deviation was 7.1Ω. Working Example 2 was better by 6Ω in average value of the CIs and by 3.9Ω in standard deviation than those of Comparative Example 2. From this result, it is understandable that positioning the distal end side of the crystal element at the −X-side of the crystal is preferred.

Additionally, positioning the distal end side of the crystal element at the −X-side of the crystal causes the crystal element in a wafer state (see FIG. 4B) to be in a state of being connected to a crosspiece at the end portion at the +X-side of the crystal. It is also found that the crystal element connected to the crosspiece at the end portion at the +X-side of the crystal is less likely to generate burrs and the like at a portion where the crystal element is folded to be separated when each crystal element is folded and taken from the wafer for separation compared with the case where the crystal element is connected to the crosspiece at the end portion at the −X-side of the crystal. From this respect, it is also understandable that it is preferred that the distal end side of the crystal element is positioned at the −X-side of the crystal and the crystal element is secured to the container at the end portion at the +X-side of the crystal.

From each of Working Examples and Comparative Examples described above, it is ideal that both corner portions 20x, 20y at the distal end side of the crystal element 20 are in approximately right angles, preferably, in a true right angle. However, in the case where the distal end of the crystal element is at the +X-side of the crystal, it has been confirmed from the results of Working Example 2 that it is preferable in improving CI when both corner portions 20x, 20y have, when expressed in dimension C using a notation of C chamfer plane, the first C-dimension portion that has the dimension C1 and runs along the Z'-axis of the crystal and the second C-dimension portion that has the dimension C2, runs along the X-axis of the crystal, and is greater than the first C-dimension portion, and a corner portion has C2/C1 of 2.7 to 4.3. However, the dimension C1 and the dimension C2 are surely preferable when each of them is close to zero.

Since the improvement of CI is achieved even though the angles θa, θb of both corner portions 20x, 20y are 115°, which is far from a right angle, the corner portions in approximately right angles having at least 90° to 115° as the angles θa, θb ensure the improved CI. Also, when W1/W0 is 0.916 or greater, namely, W1/W0 is 0.91 or greater, the CI can be improved.

In the case of the AT-cut crystal element, the ratios of W1/W0, C2/C1, and the like are effective for improving properties in most cases even when the frequency is different or when the size is different. Accordingly, the crystal elements with two types of frequencies and sizes were used to confirm the effect of this disclosure in Working Examples, and this disclosure is considered applicable to crystal elements with other frequencies and sizes. The contribution of this disclosure is even more prominent as further miniaturization of crystal elements is achieved.

For example, the used container is not limited to the example. For example, this disclosure is applicable to a piezoelectric device having another structure, such as a piezoelectric device using a container formed of a flat plate-shaped base and a cap-shaped lid member having a depressed portion to house a crystal element.

Here, the corner portions in approximately right angles referred in the present disclosure ideally have a true right angle. However, when the photolithography technique and the wet etching technique are used for manufacturing the AT-cut crystal element, the corner portions in approximately right angles do not always achieve the true right angle but have, for instance, a structure (1) or a structure (2), or a structure that includes both (1) and (2) described below. This is due to anisotropy in etching rates and the like caused by anisotropy of the crystallographic axes of the crystal for the etchant of the crystal. Accordingly, to embody this disclosure, the corner portions in approximately right angles are specifically preferred to have the structures (1) and/or (2) below.

(1) a structure where both the sides of the straight-line portion along the Z'-axis of the second side form the corner portions in approximately right angles of angles θa, θb of 90° to 115°. The angles θa, θb are formed by the second side and the sides along the X-axis of the crystal of the AT-cut crystal element.

(2) a structure where both the sides of the straight-line portion along the Z'-axis of the second side form the corner portions in approximately right angles with, in a notation of C chamfer plane, a dimension along the Z'-axis being C1 and a dimension along the X-axis being C2 greater than the C1, where C2/C1 gives 2.7 to 4.3.

The above-described structures (1) and/or (2) ensure easy manufacturing as well as achieving an improvement in CI property, as can be seen from Working Examples described later.

To embody this disclosure, the AT-cut crystal element preferably has the side of the second side forming a tapered portion that decreases in thickness along the X-axis and toward the side of the second side. This configuration ensures reducing an unnecessary mode along the X-direction of the crystal.

To embody this disclosure, the first surface preferably is a surface equivalent to a surface formed by rotating the principal surface by 4°±3.5° with the X-axis of the crystal as a rotation axis, the second surface preferably is a surface equivalent to a surface formed by rotating the principal surface by −57°±5° with the X-axis of the crystal as a rotation axis, and the third surface preferably is a surface equivalent to a surface formed by rotating the principal surface by −42°±5° with the X-axis of the crystal as a rotation axis. This configuration ensures reducing an unnecessary mode along the Z'-direction of the crystal as described in Japanese Unexamined Patent Application Publication No. 2016-197778.

The disclosure of a manufacturing method of piezoelectric device of this application manufactures the above-described piezoelectric device according to this application by a technique of a photolithography and a technique of a wet etching.

The manufacturing method of the piezoelectric device includes: a step of foaming an etching resist mask for the wet etching that includes first mask portions, second mask portions, third mask portions, and fourth mask portions on a quartz-crystal wafer such that the fourth mask portions are positioned at a +X-side of an X-axis of a crystal, the first mask portions forming a pattern of the AT-cut crystal elements in a matrix, the second mask portions extending along a direction equivalent to the Z'-axis in the matrix to form a pattern for forming crosspieces arranged in sequence along a direction of the X-axis, the third mask portions forming a bridge pattern to hold the AT-cut crystal elements on the crosspieces after the wet etching, the fourth mask portions being disposed between the corner portions on sides of the second sides of the pattern of the AT-cut crystal elements and the third mask portions and having a predetermined width W to disappear the crystals at locations of the fourth mask portions at completion of a second etching step;

a first etching step of dipping the quartz-crystal wafer on which the etching resist mask has been formed in a hydrofluoric acid-based wet etching liquid for a predetermined period;

a step of removing the first mask portions and the fourth mask portions from the quartz-crystal wafer on which the first etching has been performed;

the second etching step of dipping the quartz-crystal wafer from which the first mask portions and the fourth mask portions have been removed in a hydrofluoric acid-based wet etching liquid for a predetermined period;

a step of forming an excitation electrode on the quartz-crystal wafer on which the second etching step has been performed;

a step of dicing the AT-cut crystal elements from the quartz-crystal wafer on which the excitation electrode has been formed; and a step of connecting and fixing the diced AT-cut crystal element to the container.

With the disclosure of the piezoelectric device according to this application, since the side at the distal end side of the crystal element has the straight line portion of a predetermined amount and the corner portions are in approximately right angles in the piezoelectric device using the AT-cut crystal element having the side surface intersecting with the Z'-axis of the crystal constituted of the predetermined first to third surfaces, the piezoelectric device in which a plane area of the crystal element is expanded to improve CI compared with that of the conventional one can be provided. Furthermore, the distal end side of the crystal element positioned at the +X-side of the X-axis of the crystal ensures achieving the piezoelectric device with reduced variations in shape of the distal end of the crystal element compared with the case where the distal end side of the crystal element is at the −X-side of the X-axis of the crystal (see Working Examples described later for detail). Accordingly, further improvement in CI is achieved.

Additionally, with the disclosure of the method for manufacturing the piezoelectric device according to this application, after the mask is formed on the quartz-crystal wafer with the etching resist mask including the predetermined first to fourth mask portions, the first etching is performed on this quartz-crystal wafer, and then the second etching is performed with the first mask portions and the fourth mask portions removed. Therefore, while parts from which the fourth mask portions have been removed of the crystal elements gradually disappear in the second etching, the corner portions on the distal ends of the crystal elements do not disappear. Moreover, the bridge pattern side, that is, a portion at the distal end side of the crystal element is at the +X-side of the X-axis of the crystal, thus easily manufacturing the crystal element whose distal end side of the crystal element positioned at the +X-side. In view of this, while a decrease in the plane area on the distal end side of the crystal element is reduced, the crystal element having the desired side surface having the first to third surfaces and having the distal end positioned at the +X-side can be easily manufactured.

The principles, preferred embodiment, and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A piezoelectric device comprising:
   a conductive adhesive;
   a container; and
   an AT-cut crystal element that has an X-Z' surface expressed by crystallographic axes of a crystal as a principal surface, the AT-cut crystal element having a square shape in a planar shape, the AT-cut crystal element having at least one side surface intersecting with a Z'-axis of the crystallographic axis of the crystal constituted of three surfaces, the three surfaces being first to third surfaces intersected in an order of the first to third surfaces, the AT-cut crystal element being connected and secured to the container with the conductive adhesive on a side of a first side among two sides parallel to the Z'-axis, wherein
   when a dimension of a straight-line portion along the Z'-axis of a second side opposed to the first side is expressed as W1, and a dimension along the Z'-axis of the AT-cut crystal element is expressed as W0,
   W1/W0 is 0.91 or greater,
   the straight-line portion has both sides constituting corner portions in approximately right angles with sides along an X-axis of the crystal of the AT-cut crystal element,
   the side of the first side is at a −X-side in the X-axis of the crystallographic axis, and a side of the second side is at a +X-side in the X-axis,
   wherein
   both the sides of the straight-line portion along the Z'-axis of the second side form the corner portions in approximately right angles with, in a notation of C chamfer plane, a dimension along the Z'-axis being C1, and a dimension along the X-axis being C2 greater than the C1, where C2/C1 gives 2.7 to 4.3.

2. The piezoelectric device according to claim 1, wherein both the sides of the straight-line portion along the Z'-axis of the second side form the corner portions in approximately right angles of angles θa, θb of 90° to 115°, the angles θa, θb being formed by the second side and the sides along the X-axis of the crystal of the AT-cut crystal element.

3. The piezoelectric device according to claim 1, wherein the AT-cut crystal element has the side of the second side forming a tapered portion that decreases in thickness along the X-axis and toward the side of the second side.

4. The piezoelectric device according to claim 3, wherein when a dimension along the X-axis of the tapered portion is expressed as AX, and a thickness of the AT-cut crystal element is expressed as T,
   ΔX/T gives 3.05 to 3.09.

5. The piezoelectric device according to claim 3, wherein the tapered portion is constituted of four surfaces.

6. The piezoelectric device according to claim 1, wherein the first surface is a surface equivalent to a surface formed by rotating the principal surface by 4°±3.5° with the X-axis of the crystal as a rotation axis,
   the second surface is a surface equivalent to a surface formed by rotating the principal surface by −57°±5° with the X-axis of the crystal as a rotation axis, and
   the third surface is a surface equivalent to a surface formed by rotating the principal surface by −42°±5° with the X-axis of the crystal as a rotation axis.

7. A manufacturing method of a piezoelectric device that manufactures the piezoelectric device according to claim 1 by a technique of a photolithography and a technique of a wet etching, the manufacturing method of the piezoelectric device comprising:
   forming an etching resist mask for the wet etching that includes first mask portions, second mask portions, third mask portions, and fourth mask portions on a quartz-crystal wafer, such that the fourth mask portions are positioned at a +X-side of an X-axis of a crystal, the first mask portions forming a pattern of the AT-cut crystal elements in a matrix, the second mask portions extending along a direction equivalent to the Z'-axis in the matrix to form a pattern for forming crosspieces arranged in sequence along a direction of the X-axis, the third mask portions forming a bridge pattern to hold the AT-cut crystal elements on the crosspieces after the wet etching, the fourth mask portions being disposed between the corner portions on sides of the second sides of the AT-cut crystal elements and the third mask portions and having a predetermined width W to disappear the crystals at locations of the fourth mask portions at completion of a second etching step;
   performing a first etching step of dipping the quartz-crystal wafer on which the etching resist mask has been formed in a hydrofluoric acid-based wet etching liquid for a predetermined period;
   removing the first mask portions and the fourth mask portions from the quartz-crystal wafer on which the first etching step has been performed;
   performing the second etching step of dipping the quartz-crystal wafer from which the first mask portions and the fourth mask portions have been removed in a hydrofluoric acid-based wet etching liquid for a predetermined period;
   forming an excitation electrode on the quartz-crystal wafer on which the second etching step has been performed;
   dicing the AT-cut crystal elements from the quartz-crystal wafer on which the excitation electrode has been formed; and
   connecting and fixing the AT-cut crystal element which is diced to the container.

* * * * *